US007647220B2

(12) United States Patent
Kulshreshtha et al.

(10) Patent No.: US 7,647,220 B2
(45) Date of Patent: Jan. 12, 2010

(54) TRANSISTOR-LEVEL TIMING ANALYSIS USING EMBEDDED SIMULATION

(75) Inventors: Pawan Kulshreshtha, San Jose, CA (US); Robert J. Palermo, Shoreview, MN (US); Mohammad Mortazavi, Santa Clara, CA (US); Cyrus Bamji, Fremont, CA (US); Hakan Yalcin, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 586 days.

(21) Appl. No.: 10/042,512

(22) Filed: Oct. 18, 2001

(65) Prior Publication Data

US 2003/0115035 A1 Jun. 19, 2003

(51) Int. Cl.
*G06F 17/50* (2006.01)

(52) U.S. Cl. ............................. 703/19; 716/4
(58) Field of Classification Search ............ 703/2, 703/13, 14, 15, 16, 19; 716/6, 7, 4
See application file for complete search history.

(56) References Cited

U.S. PATENT DOCUMENTS

| 5,802,349 A * | 9/1998 | Rigg et al. ............... 716/2 |
| 5,831,869 A * | 11/1998 | Ellis et al. ............... 716/6 |
| 5,946,475 A * | 8/1999 | Burks et al. ............... 716/6 |
| 6,453,443 B1 * | 9/2002 | Chen et al. ............... 716/1 |
| 6,473,881 B1 * | 10/2002 | Lehner et al. ............... 716/2 |
| 6,499,129 B1 * | 12/2002 | Srinivasan et al. ............... 716/4 |
| 6,588,000 B2 * | 7/2003 | Gutwin et al. ............... 716/7 |
| 6,807,520 B1 * | 10/2004 | Zhou et al. ............... 703/14 |
| 6,829,755 B2 * | 12/2004 | Gutwin et al. ............... 716/6 |
| 2003/0033583 A1 * | 2/2003 | Gutwin et al. ............... 716/7 |

OTHER PUBLICATIONS

"A Three-tier Technique for Spice Verification of Transistor Level Timing Analysis", S. Savithri et al, Proceedings of Twelfth International Conference On VLSI Design, Jan. 199.*
"Transistor-Level Timing Analysis Using Embedded Simulation", P. Kulshreshtha, et al, Cadence Design Systems, Dec. 2002.*

(Continued)

*Primary Examiner*—Paul L Rodriguez
*Assistant Examiner*—Russ Guill
(74) *Attorney, Agent, or Firm*—Vista IP Law Group, LLP

(57) ABSTRACT

A high accuracy method for transistor-level static timing analysis is disclosed. Accurate static timing verification requires that individual gate and interconnect delays be accurately calculated. At the sub-micron level, calculating gate and interconnect delays using delay models can result in reduced accuracy. Instead, the proposed method calculates delays through numerical integration using an embedded circuit simulator. It takes into account short circuit current and carefully chooses the set of conditions that results in a tight upper bound of the worst case delay for each gate. Similar repeating transistor configurations of gates in the circuit are automatically identified and a novel interpolation based caching scheme quickly computes gate delays from the delays of similar gates. A tight object code level integration with a commercial high speed transistor-level circuit simulator allows efficient invocation of the simulation.

36 Claims, 5 Drawing Sheets

OTHER PUBLICATIONS

Timothy M. Burks and Robert E. Mains, "Incorporating Signal Dependencies into Static Transistor-Level Delay Calculation", 1997, retrieved from www.scholar.google.com as HTML, pp. 1-13.*

Simon Haykin, "Neural Networks A Comprehensive Foundation", second edition, 1999, Prentice Hall, pp. 68-69.*

Russell R. Barton, "Simulation Metamodels", 1998, Proeedings of the 1998 Winter Simulation Conference, pp. 167-174.*

Anonymous, "Circuit Semantics Introduces New Capabilities in DynaCore and DynaCell for High-Performance IC Designers", Apr. 10, 2000, from the internet at http://findarticles.com/p/articles/mi_m0EIN/is_2000_April_10/ai_61396112/print.*

Ackland, Bryan D. et al. "Event-EMU: An Event Driven Timing Simulator for MOS VLSI Circuits", Proc. of IEEE*ICCAD, ICCAD* -89, *Digest of Technical Papers* (Nov. 1989) pp. 80-83.

Cherry, James J. "Pearl: A CMOS Timing Analyzer", *Proc. of 25$^{th}$ ACM/IEEE DAC* (1988) pp. 148-153.

Dartu, Florentin et al. "TETA: Transistor-Level Engine for Timing Analysis", *Proc. of IEEE/ACM DAC* (1998) pp. 595-598.

Hirata, Akio et al. "Proposal of a Timing Model for CMOS Logic Gates Driving a CRC π Load", *Proc. of IEEE/ACM ICCAD* (Nov. 1998) pp. 537-544.

Kulshreshtha, Pawan et al. "Transistor-Level Timing Analysis Using Embedded Simulation", *Proc. of IEEE/ACM ICCAD* (2000) pp. 344-348.

Ohlrich, Miles et al. "*SubGemini*: Identifying SubCircuits using a Fast Subgraph Isomorphism Algorithm", *Proc. of 30$^{th}$* ACM/IEEE DAC (1993) pp. 31-37.

Ousterhout, John K. "A Switch-Level Timing Verifier for Digital MOS VLSI", IEEE Trans. on CAD, vol. CAD-4, No. 3 (Jul. 1985) pp. 336-349.

Rao, Vasant et al. "EinsTLT: Transistor Level Timing with EinsTimer", *Proc. of Int. Workshop on Timing Issues in the Spec. and Syn. of Digital Systems* (*TAU*) (1999) pp. 1-6.

Yu, Meng-Lin et al. "VLSI Timing Simulation with Selective Dynamic Regionization", *Proc. of IEEE/ACM ICCAD* (Nov. 1994) pp. 195-199.

Strang, G., "Introduction to Applied Mathematics," Wellesley-Cambridge Press (1986) Chapter 5, pp. 367-470.

* cited by examiner

| Nodes | Arc i0 rise -> o1 fall | Arc d fall -> o1 rise |
|---|---|---|
| i0 | RISE | GND |
| i1 | VDD | VDD |
| i2 | GND | GND |
| b | GND | FALL |
| bb | VDD | RISE |
| n0 | VDD | VDD |
| n1 | GND | GND |
| n2 | VDD | VDD |
| o1 | VDD | GND |

(a) Master subcircuit with single gate    (b) Excitation voltages

| Nodes | Arc d rise -> o rise |
|---|---|
| a | GND |
| b | GND |
| b_b | VDD |
| c | GND |
| c_b | VDD |
| d | RISE |
| e | VDD |
| f | GND |
| o | GND |

(c) Master subcircuit with multiple gates    (d) Excitation voltages

TRANSISTOR-LEVEL TIMING ANALYSIS USING EMBEDDED SIMULATION

TECHNICAL FIELD

The invention relates generally to simulation and timing verification technology, and more particularly to a method and system for transistor-level timing analysis using embedded simulation.

BACKGROUND OF THE INVENTION

Static timing analysis (STA) allows quick and comprehensive timing verification of large circuits. Compared to simulation, STA is much faster and guarantees identification of the critical paths in a circuit. Simulation, on the other hand, is impractical for large circuits because simulators are typically slow and sometimes fail to find the right input vectors to excite the critical paths. Usually, STA has three main steps: (1) calculating delays of individual gates and interconnect, (2) adding up the delays of all gates to obtain the path delays for the entire circuit, and (3) verifying the circuit constraints by checking whether certain signal transitions occur before or after certain other transitions. For gate-level circuits, a pre-characterized timing model is used for each gate type. Typically the timing models, which are part of the design library, are generated only once, allowing extensive simulations to be performed in order to accurately model each gate. For transistor-level circuits, however, there are no pre-characterized gates, and delay calculation must be performed on the fly. A well-known method for analyzing circuits of this type is circuit simulation, which produces very detailed timing information, such as waveforms and delays, by solving non-linear differential equations. However, this method is very time consuming and requires a large number of input vectors to be applied to the circuit. In addition, there are problems in finding appropriate input vectors to simulate the critical paths of a circuit. Therefore, direct use of simulation is inapplicable to large, practical circuits.

To speed up STA for transistor-level circuits, various approximation methods for delay calculation based on heuristic formulas or lookup tables have been developed. These methods provide a closed form solution to a non-linear system of equations describing gate behavior and are commonly used in delay calculators. However, as features sizes become smaller, these approximation methods become increasingly inaccurate because new considerations, which were previously neglected, must be taken into account. Enhanced models that attempt to rectify this accuracy deficiency not only become cumbersome but also produce results that under certain conditions are questionable. For high accuracy and reliability, closed form expression for delay can no longer be used. Therefore, it has become necessary to go back to the method of solving non-linear equations via numerical integration, i.e., using circuit simulation.

SUMMARY OF THE INVENTION

This invention provides a high accuracy system and method for transistor-level STA based on efficient use of an embedded simulator. The system and method employ several unique features to minimize simulation time. The key to the efficiency of the proposed approach is a master-based delay calculation scheme whereby simulation is performed only for small groups of transistors called channel connected components (CCCs). Before analyzing a circuit, the system first identifies the circuit's unique CCCs, also called masters. All the masters of a circuit design are preloaded into a simulator. When the delays of a particular CCC need to be calculated, only the master corresponding to this CCC is simulated. The masters are parameterized so that all the device and interconnect parameters (such as device widths, resistor resistances, and node wire capacitances) for an instance of the master can be set during simulation. A fanout reduction technique is proposed that collapses all similar fanout devices into one device so as to minimize the number of masters.

Another key feature that enhances the efficiency is the use of a single simulation to calculate worst case delay. The fixed voltages on the side inputs and the initial voltages on internal nodes of CCCs are chosen to give the worst case delay by maximizing the number of nodes, and hence the capacitance, to be charged or discharged. This method also ensures that short-circuit effect is taken into account. Normally, a single input of a CCC is allowed to switch. However, in case of transmission gates, both the FET gate inputs switch for increased accuracy. Otherwise, switching only one FET gate may cause the output to fail to switch completely. Tight integration of the simulator into the STA system allows to run the simulator long enough to obtain delay and signal transition times and thus enhances the runtime performance.

Another key feature of the method is the use of a novel caching scheme to minimize the number of simulations required. Data relative to each performed simulation is saved with the intent of using that data to derive estimated results for other prospective simulations. Given a candidate CCC whose delays need to be determined, the cache is searched to find other CCC's of the same master, whose simulation input parameter values (device widths, node wire capacitances, etc.) are close to those of the candidate. If such CCC's are found, a Gram-Schmidt Orthonormalization algorithm is applied to estimate the simulation result for the candidate CCC. Even though a tight matching criterion is used in order to maintain high accuracy (within 1%), it has been observed that the number of cache hits is typically very high. The experiments performed on several industrial and benchmark circuits to evaluate the effectiveness of the cache indicate that the caching scheme can reduce the run time by as much as 96%. Overall, the simulation results obtained using the method according to this invention are accurate to within 5% of conventional simulation, with performance approaching that of a model based STA.

DETAILED DESCRIPTION OF THE INVENTION

1. Static Timing System

Figure 1:
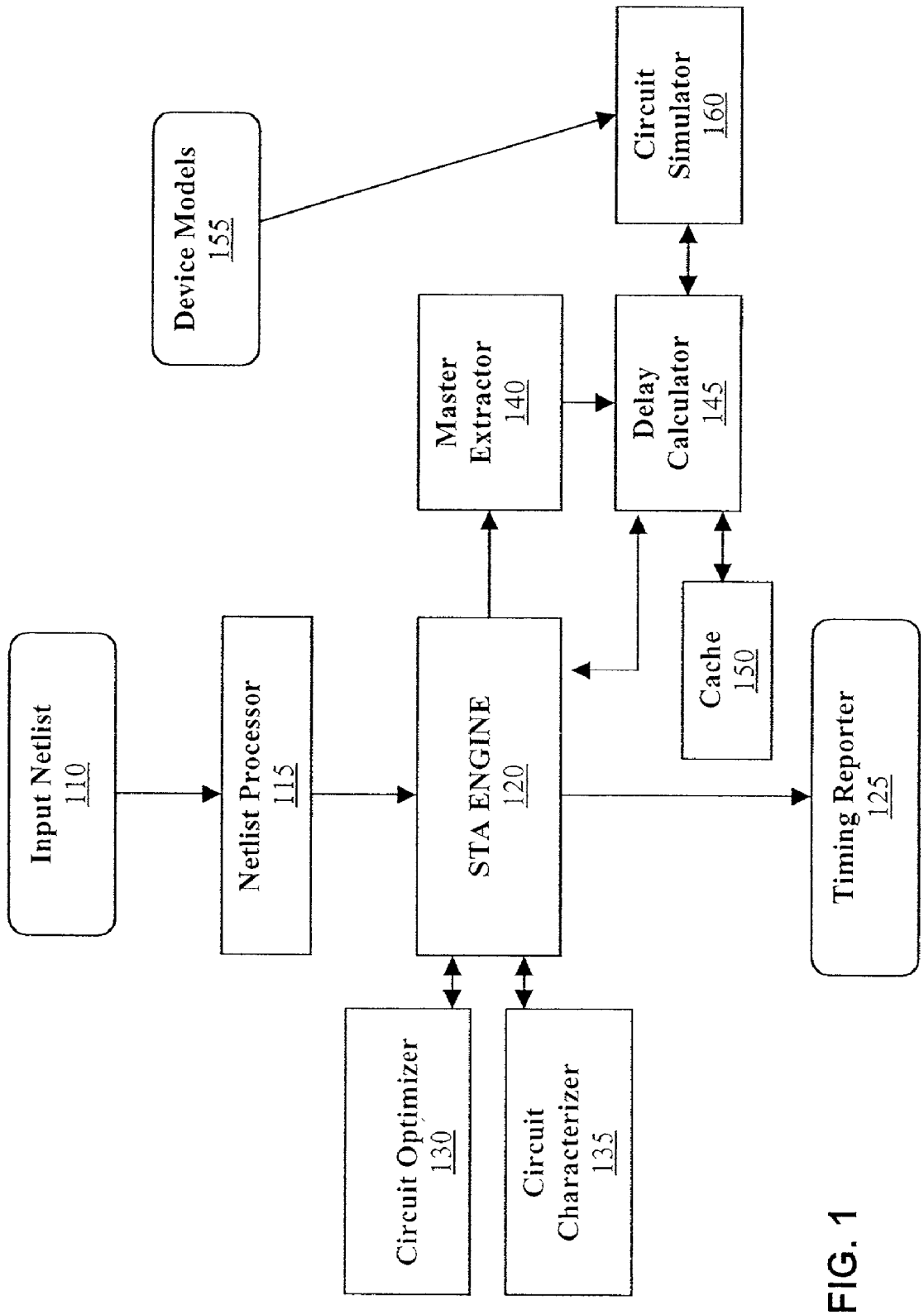
FIG. 1 is a block diagram showing a system for static timing analysis according to the invention.

Referring to FIG. 1, illustrated is a block diagram of a STA system 100. After reading an input netlist 110, a netlist processor 115 creates an internal representation of a circuit design. A master extractor 140 identifies and generates masters or master sub-circuits. Each of these masters represents one class of basic sub-circuits with unique channel-connected components (CCCs). A delay calculator 145 pre-loads these masters, along with the device models 155, into an event-driven transistor-level simulator (EMU2) 160. To calculate the delay of an instance, the delay calculator 145 sets the parameters of the corresponding master along with its input conditions, and queries a cache 150, which stores the results of all previous simulations. If a match is found, the cache 150 returns the output waveform. Otherwise, the simulator 160 is run to calculate the output waveform. The caching scheme used by the cache 150 is based on interpolation of the simulation results of the same master configuration with similar parameters.

A timing report device 125, which is a built-in incremental timing capability, allows quick recalculation of the circuit delays affected by local circuit modifications. This feature enables various applications, including circuit optimization 130 and block characterization 135, to be linked into this system to form a comprehensive transistor-level timing solution.

2. Sub-Circuit Extraction

For a small circuit, it is feasible to simulate the entire circuit and calculate its delays. However, it is either impossible or computationally very expensive to simulate large circuits as a whole. The key idea of this invention is to partition a large, transistor-level circuit into a number of small sub-circuits and then simulate each master sub-circuit individually.

Figure 2:
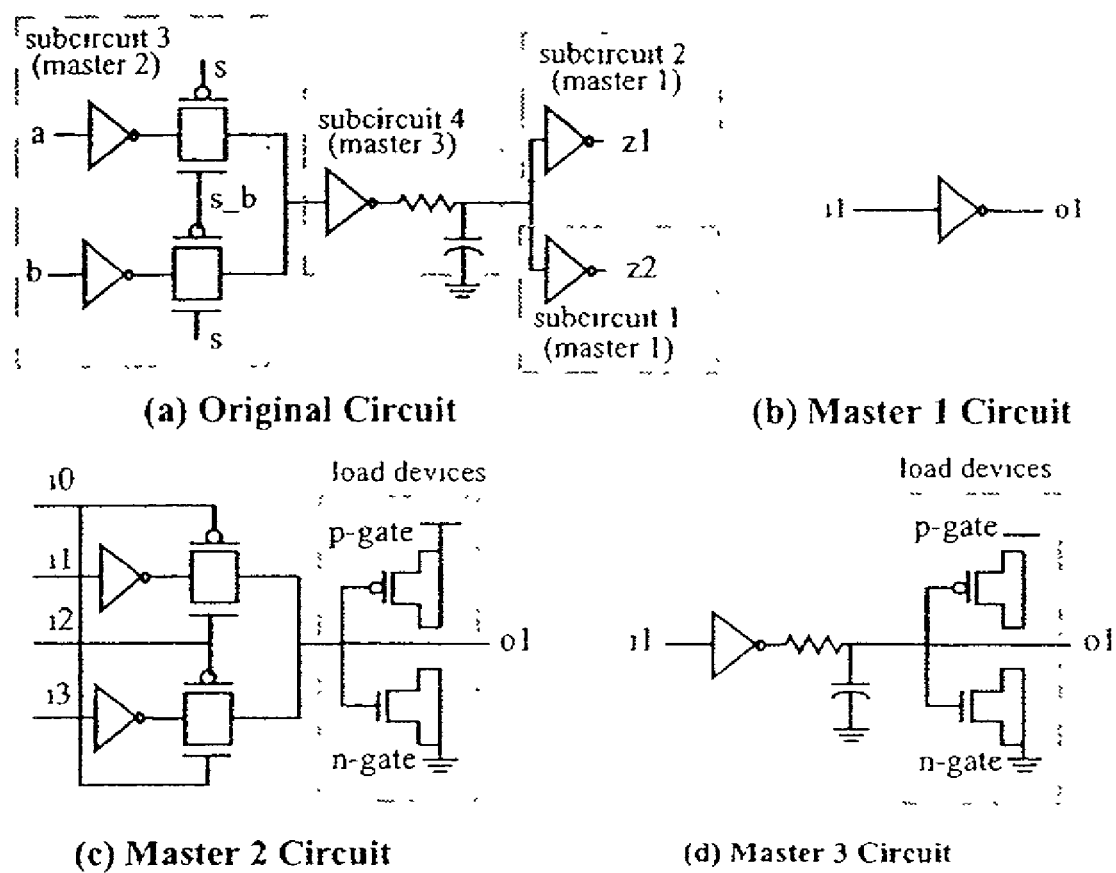
FIG. 2(a) is a circuit diagram illustrating an exemplary circuit with four basic sub-circuits 1-4 identified in dashed line.
FIG. 2(b) is a circuit diagram illustrating a first master sub-circuit which 3 represents the basic sub-circuits 1-2 identified in the circuit of FIG. 2(a)
FIG. 2(c) is a circuit diagram illustrating a second master sub-circuit which represents the sub-circuit 3 in the circuit of FIG. 2(a)
FIG. 2(d) is a circuit diagram illustrating a third master sub-circuit which represents the sub-circuit 4 in the circuit of FIG. 2(a)

A transistor-level circuit consists of channel connected components (CCCs), which are groups of transistors connected via source/drain pins and resistors. Some of these CCCs, in different instances, may be represented by a same basic sub-circuit. Only values such as transistor sizes, capacitances and other similar parameters might vary from instance to instance. Each such unique basic sub-circuit is called a master or a master sub-circuit. The RC interconnect networks are part of the masters. FIG. 2(a) shows an exemplary circuit with its four sub-circuits identified by dashed line.

The purposes to extract master sub-circuits from a transistor-level circuit are (1) to reduce the size of the netlist 110 to be loaded into the simulator (EMU2) 160; (2) to avoid reloading of the netlist in the simulator; and (3) to allow the simulation of each sub-circuit separately by simulating the corresponding master sub-circuit only.

The master extractor 140 traverses the input netlist 110 and identifies all sub-circuits of the circuit. It creates a new master each time a new basic sub-circuit (CCC) is found. It uses a pattern recognition algorithm to match the same basic sub-circuits. Finally, once all the masters are found, the master extractor 140 creates a two-level hierarchical netlist with these masters instantiated at the top level. This netlist is given to the circuit simulator 160 as input during delay calculation. FIGS. 2(b), 2(c), and 2(d) show three masters extracted for the circuit of FIG. 2(a). Note that sub-circuit 1 and sub-circuit 2 belong to a same master, i.e. master 1.

The masters are parameterized in order for each one to represent all the CCCs having the same basic sub-circuit. Each master has the following parameterizable attributes: device width (W), device source area (AS), device drain area (AD), device source perimeter (PS), device drain perimeter (PD), wire resistance values and node wire capacitance values. These attributes are set before the simulation.

In order to decrease the number of masters that need to be created, the loading (fanout) devices for each master output port are reduced to two FET devices (p-gate and n-gate) with equivalent parameters as shown in FIGS. 2(c) and (d). The equivalent device gate capacitance is the sum of the gate capacitances of all the devices connected to the output node. Hence, the parameters (AS, AD, PS, PD) for each equivalent FET are approximated by the sum of the corresponding parameters of the similar (P or N) fanouts. The length ($L_{eq}$) and width ($W_{eq}$) of each equivalent FET are approximated as:

$$L_{eq} = \sum^{n} L_i / n \text{ and } W_{eq} = \sum^{n} (W_i\_L_i) / L_{eq}$$

Figure 3:
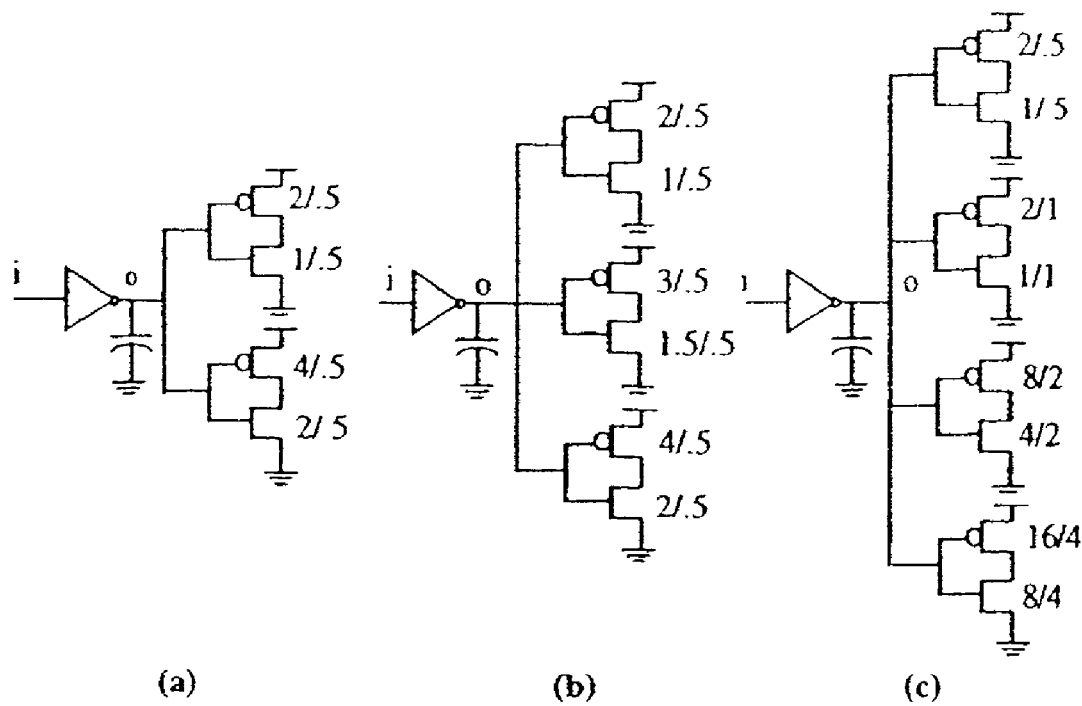
FIG. 3(a)-(c) are three circuit diagrams illustrating three sub-circuits on which SPICE simulations were performed.
FIG. 3(d) is a circuit diagram showing an equivalent sub-circuit (i.e. a master sub-circuit) of the three sub-circuits illustrated in FIG. 3(a)-(c)
FIG. 3(e) is graphical representation showing a comparison of circuit delays with actual loading vs. equivalent loading for each of the three sub-circuits illustrated in FIG. 3(a)-(c)
Figure 3:
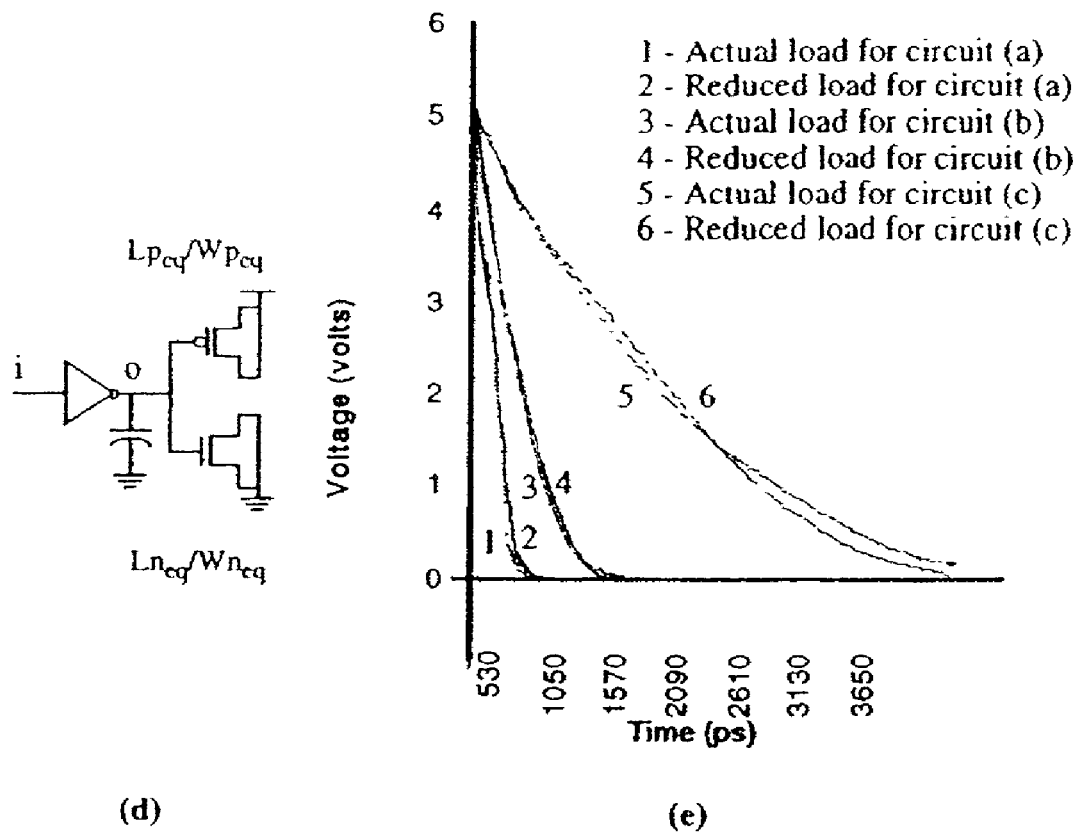

Now referring to FIG. 3, illustrated is a comparison of circuit delays with actual vs. reduced loading. SPICE simulations were performed with the circuits shown in FIGS. 3(a), (b) and (c). Each circuit is simulated to calculate the exact output waveform, which is then compared to the waveform obtained using the equivalent circuit of FIG. 3(d). The length and width values for the N and P equivalent FETs of FIG. 3(d) are illustrated in Table 1.

TABLE 1

| Circuit | $W_{eq}/L_{eq}$ for P(__) | $W_{eq}/L_{eq}$ for N (__) |
|---------|---------------------------|----------------------------|
| (a)     | 6.0/0.5                   | 3.0/0.5                    |
| (b)     | 9.0/0.5                   | 4.5/0.5                    |
| (c)     | 44.27/1.87                | 22.0/1.87                  |

The output waveforms obtained in this experiment are plotted in FIG. 3(e), which shows that in all these three cases, the waveform for the reduced circuit closely matches the original one and the impact of load reduction on the gate delay is small. On average, the gate delay changes by 3% with respect to the original circuit without reduction.

3. Sub-Circuit Simulation

The delay of a gate usually can be found by simulating the gate with a set of input vectors. However, even for small circuits, this method requires multiple simulations. The method according to this invention uses a single simulation to calculate the worst case delay by carefully choosing the input excitations and the internal node initial conditions.

The timing behavior of each sub-circuit or gate in the circuit is represented internally by a set of arcs, corresponding to the causal relationships between its inputs and outputs. For an arc, all the devices through which the output is charged or discharged are called arc devices, the path from the supply to the arc output node through the arc devices is called the arc path and the arc device driven by the arc input is called the trigger device.

Figure 4:
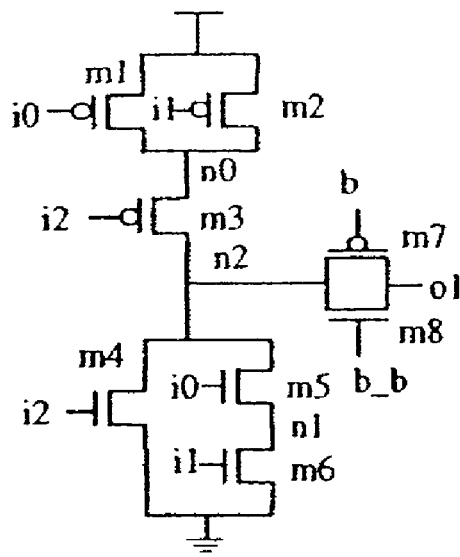
FIG. 4(a) is a circuit diagram illustrating a master sub-circuit with a single gate.
FIG. 4(b) is a value table showing the corresponding excitation voltages for two arcs identified in FIG. 4(a)
FIG. 4(c) is a circuit diagram illustrating a master sub-circuit with multiple gates.
FIG. 4(d) is a value table illustrating the excitation voltages for an arc identified in FIG. 4(c)
Figure 4:
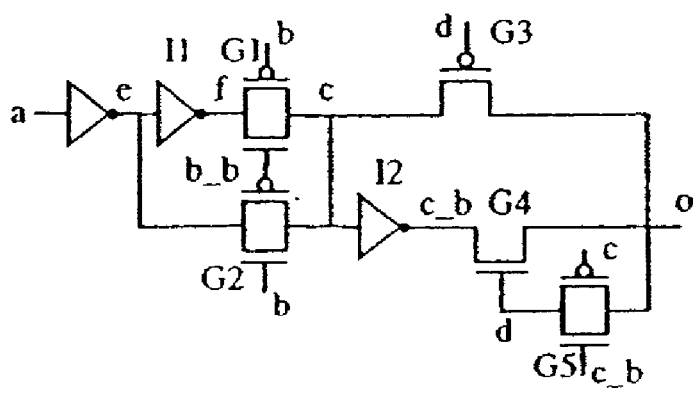

Referring to FIG. 4(a) and FIG. 4(b), an exemplary master sub-circuit with a single gate and the corresponding excitation voltages are illustrated. In FIG. 4(a), for the arc from the rising transition of i0 to the falling transition of o1, devices m6, m5, m7 and m8 are arc devices, the path GND-n1-n2-o1 is the arc path and the device m5 is the trigger device. The calculation of arc delays for the entire circuit is done in a levelized manner, proceeding from the circuit inputs to its outputs so that slews are available at all arc inputs. Prior to any delay calculation, all the masters along with the device models are preloaded into the circuit simulator 160. When an arc delay is being calculated, the corresponding master parameters are set in the simulator through an API. These master parameters, including transistor sizes, wire resistances, and node wire capacitances, are obtained from the sub-circuit surrounding the arc.

A waveform with a single transition, rise or fall, is applied to the switching input of a sub-circuit. For a primary input, a two-point waveform is derived from the input slew. For an intermediate node, the output of the driving gate produces the input waveform. Normally, a single input of a sub-circuit is allowed to switch. However, in case of transmission gates, both the FET gate inputs switch for increased accuracy. Switching only one FET gate may cause the output to fail to switch completely. Also, one of the transmission gate input waveforms is delayed by the difference in arrival times between two gate inputs.

The fixed voltages on the side inputs and the initial voltages on internal nodes are set to give the worst case delay by maximizing the number of nodes, and hence the capacitance, to be charged or discharged. The algorithm to find the worst case excitation voltages, first sets the default excitations for all the nodes in the master sub-circuit to the arc output initial state. It then turns ON all the devices on the arc path and if necessary, overwrites the default initial voltages on internal nodes connected to supply or ground. Finally, it traverses each device on paths from arc output node to supply and ground and turns it ON, if it does not enable a parallel path to supply or ground. For a given arc, the excitation voltages can be found using the following procedure:

```
/*All the excitation voltages set on master inputs are either fixed
voltages (for the side inputs) or input waveforms (for the driving
inputs) and the rest are initial voltages (for the internal nodes).
*/
SetArcExcitations (arc) {
    /* Set default excitation */
    for (each node in arc_master_sub-circuit)
      set node Excitation = arc_output InitialState
    SetArcDeviceExcitations (arc)
    /* Set the remaining pass-gates to OFF, if possible */
    for (each pass-transistor device in arc_master_sub-circuit) {
       if (device_gate_node is not set)
          set device_gate_node Excitation that turns OFF the device
       if (device has complementary_device &&
           complementary_device_gate_node is not set)
           set complementary_device_gate node Excitation that turns
               OFF the device
    }
    if (arc output is rising) {
```

```
-continued

/* Set pullup device excitations first, it will automatically set
the
       excitations for the complementary pulldown devices */
       SetNonArcDeviceExcitations (arc, VDD)
    /* Set pulldown device excitations for structures which are
       non-complementary */
       SetNonArcDeviceExcitations (arc, GND)
    } else {
       SetNonArcDeviceExcitations (arc, GND)
       SetNonArcDeviceExcitations (arc, VDD)
    }
}
SetArcDeviceExcitations (arc) {
    for (each arc_device)
       if (device is trigger_device) {
           set device_gate_node Excitation = InputWaveform
           if (device is pass-transistor &&
              device has complementary_device)
              set complementary_device_gate_node Excitation
                  = InputWaveform
       } else {
       set device_gate_node Excitation that turns ON the device
       if (device is on arc_path between supply node (vdd or gnd) and
           trigger_device) {
           /* Overwrite default initial voltages */
           set device_source_node Excitation = supply
           set device_drain_node Excitation = supply
       }
    }
}
SetNorArcDeviceExcitations(arc, supply_node) {
    for (each path from arc_output_node to supply_node)
       for (each device on path)
          if (device_gate_node is not set)
             if (making the device ON does not make a parallel path ON)
                set device_gate_node Excitation that turns ON the device
             else
                set device_gate_node Excitation that turns OFF the device
}
```

If a master sub-circuit has multiple gates connected through a complex pass-gate structure, there may be side paths driving the arc output node. The excitation voltages for nodes in the side path are determined by propagating output node excitation through turned ON pass-gates and the driving devices. This method results in absolute worst case excitations for most circuits. The circuit types supported include static CMOS, pass-gates, latches and domino gates. FIG. 4(a) shows a master sub-circuit with a single gate and FIG. 4(b) shows the excitation voltages of the circuit for two arcs. FIG. 4(c) shows a master circuit with multiple gates. The arc d rise →0 rise through transmission-gate G5 enables the side path a-e-f-c-cb-o. FIG. 4(d) shows the excitation voltages for this arc.

Once the master parameters are set, the simulator (EMU2) is called. Its dynamic regionization and event-based algorithm provide fast yet accurate simulations (<5% accuracy and 10-50×faster vs. SPICE). In this invention, enhancements have been made to provide for dynamically controllable simulation with a callback mechanism, and master-based simulation to avoid circuit reloading. The simulator's tight integration into the STA environment allows the simulation to be run only for the period long enough to calculate the delay and output slew, thus enhancing the performance. Finally, the delay and slew values are calculated from the input and output waveforms.

5. Caching Scheme

The concept of global caching is to cache or save data relative to specific simulations with the intent of using that data to derive estimated results for other prospective simulations. The goal is to substantially reduce the number of simulations required during execution. The keys to caching are that cache retrieval must be efficient and the retrieved result must be very close to the result that would have occurred if simulation were performed.

A simulation can be considered as a function $S(p_i)$ where $p_i$ represents various inputs to the simulation with S being the result, i.e., output waveform. The input parameters to the simulation include: the master sub-circuit, the input node excitations, the internal node initial conditions, the device sizes (W, AS, AD, PS, PD), the node capacitances, the wire resistances, and the output node. These input parameters are classified into two types: discrete or fixed type and variable type. The discrete or fixed type parameters include master sub-circuit, nodes, and initial conditions. Simulations that differ on any of these fixed parameters are fundamentally different simulations. Incremental changes in variable type parameters result in incremental differences in the simulation results. Thus, the inputs to every simulation can be represented as a point P, whose coordinates are the input parameters, and thus having the form $(pf_j, pv_k)$, where $pf_j$ represent the fixed type parameters and $pv_k$ represent the variable type parameters.

For the purpose of caching, input waveforms are represented by three values, those being fall to rise time ($t_{fr}$), time to threshold ($t_{thr}$), and threshold offset from first input waveform ($t_{off}$). On the other hand, output waveforms, which are the results of simulations, are stored in the cache essentially intact. They undergo a reduction that eliminates redundant points along contiguous segments of the piecewise-linear waveform whose slopes are within a pre-set tolerance. This reduction preserves waveform integrity, and typically results in a 50%-75% reduction in waveform size. Using the following definitions for waveform (wf)

$t_{vlow}$(wf): wf low voltage time (normally 10%)

$t_{vthresh}$(wf): wf threshold voltage time (normally 50%)

$t_{vhigh}$(wf) wf high voltage time (normally 90%)

the formulae for the input waveform representation are $t_{fr}(wf) = t_{vhigh}(wf) - t_{vlow}(wf)$, $t_{thr}(wf) = t_{vthresh}(wf) - \min(t_{vlow}(wf), t_{vhigh}(wf))$, $t_{off}(wf) = t_{vthresh}(wf) - t_{vthresh}(wf_{input1})$ In order for retrieval to be efficient, points are partitioned into multi-dimensional rectangular grids, called point classes. The grid point function G(P) is used to determine the point class that P should be placed in.

The result $G(P) = (g(pf_j), g(pv_k))$ is determined as follows. For fixed parameters, $g(pf_j) = pf_j$. For variable parameters, each parameter type has a pre-defined parameter range array, $A[0 \ldots N]$, with $A[0] = 0$.

Figure 5:
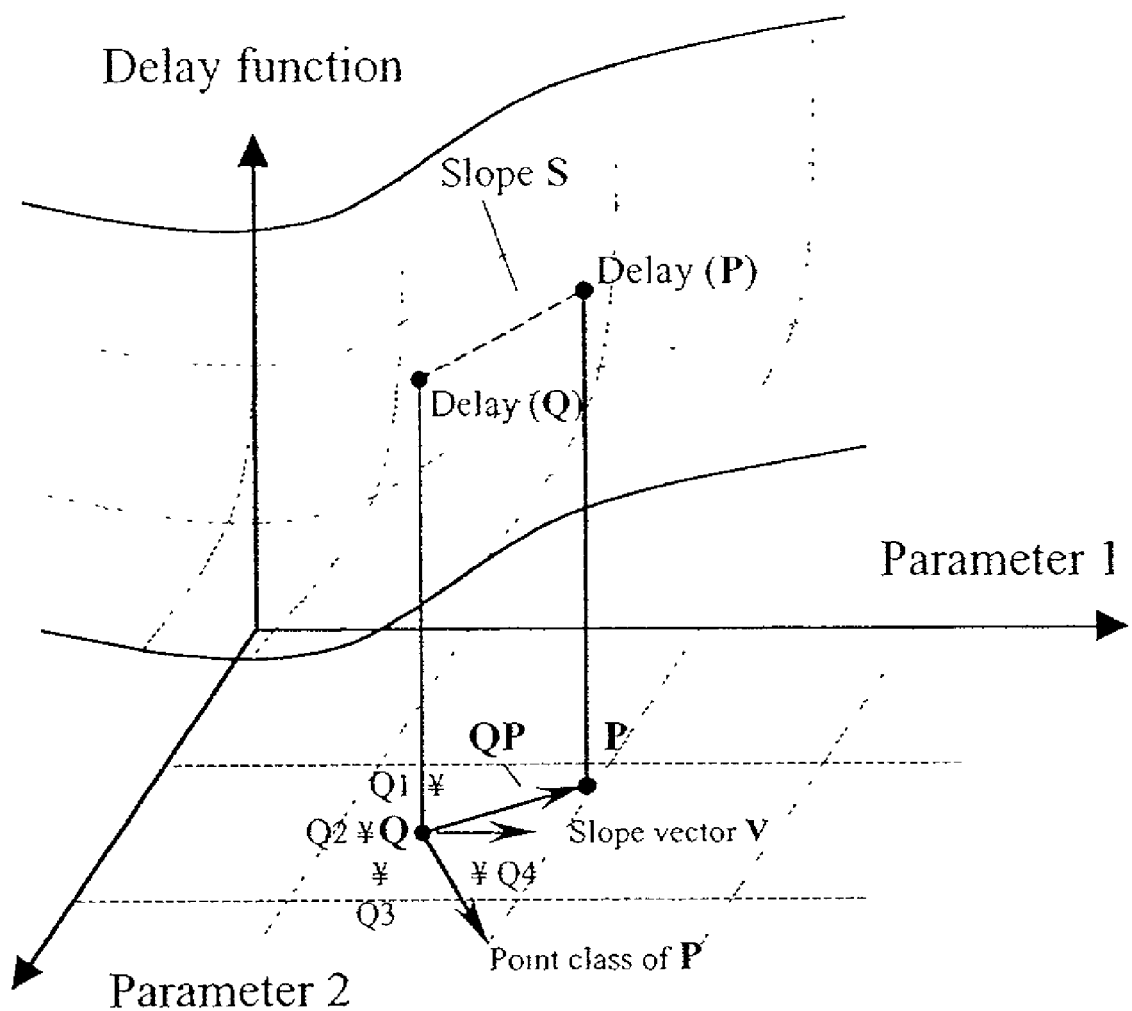
FIG. 5 is a graphical representation of the interpolation used by the caching scheme.

$g(pv_k) = m$ if $A[m] \leq pv_k < A[m+1]$ and $0 \leq Pv_k < A[N]$
$= N$ if $pv_k \geq A[N]$
$= -g(-pv_k)$ if $pv_k < 0$ For example, the range array for capacitance is {0, $1 \times 10^{-14}$, $3.2 \times 10^{-14}$, $1 \times 10^{-13}$, $3.2 \times 10^{-13}$, $1 \times 10^{-12}$, $5 \times 10^{-12}$}). So for capacitance value pv=75 FF, g(pv)=2. Referring to FIG. 5, depicted is a graphical representation of the interpolation used by the caching scheme. Before a simulation is performed, the input parameters for the prospective simulation are used to create a point P. In order to avoid a simulation, there must exist a point Q, in the same point class as P, that is very close to P. The formula used for calculating closeness is a weighted normalized RMS of the differences between the variable coordinates of the points.

The formula for closeness between P and Q is $C(P,Q) = (\Sigma(((pv_k - qv_k)w_k/r_k)^2)/\Sigma(w_k^2))^{1/2}$ where $r_k$, the range size for $pv_k$, is given by $r_k = A[|g(pv_k)| + 1] - A[|g(pv_k)|]$  if $|g(pv_k)| < N$ $= A[N] - A[N-1]$  if $|g(pv_k)| = N$ and $w_k$ is the relative weighting of the parameter type of $pv_k$. The weightings of 1.0 for time values, 0.7 for device sizes, 0.7 for capacitances, 0.3 for resistances and 0.1 for areas were determined to yield the best results. Benchmarking revealed that points must be very close for cached results to be close enough to use in lieu of simulation. The implementation according to this invention provides 4 levels of cache usage, with cache level 2, for example, requiring closeness values, $C(P, Q) \leq 0.003$, to result in cached results within 3% of simulation.

Once a close point Q is found, the slope (S) of the delay function along vector QP needs to be computed. By multiplying this slope S, with |QP|, the difference between delay (P) and delay(Q) can be calculated, i.e. delay(P)−delay(Q)= S*|QP|. This delay difference is henceforth denoted as Δ(P, Q). S can be calculated in terms of the slope of the delay functions on each of the primary axes of the space in which the points reside. If vector V is the vector whose coordinates are these slopes, the expression for the delay difference becomes: $\Delta(P, Q) = V\_QP$.

Note that vector V points in the direction of maximum slope at Q. To determine vector V, the cached points near Q are used. For each such $Q_m$ near Q, the slope of the delay function along vector $Q_mQ$ can be readily computed:

Slope=(delay($Q$)−delay($Q_m$))/|$Q_mQ$|

Using these delay slopes, a modified Gram-Schmidt Orthonormalization routine is applied to calculate the slope of the delay function along each of the primary axes, resulting in the slope vector V.

Once vector V is calculated, the difference in delay is computed, i.e. $\Delta(P, Q) = V\_QP$. Note that $\Delta(P, Q)$ can be computed even if some of the coordinates of vector V are unknown. Specifically, the coordinates of vector V for the axes for which vector QP is null, are not needed. Once $\Delta(P, Q)$ has been calculated, the resulting waveform S(P) can be derived from the waveform S(Q). There is a direct relationship between the use of cached results and the reduction of run time for delay calculation on a design. For example, if half of the simulations can be avoided by use of cached results, then there is virtually a 50% run time reduction. Each of the four cache retrieval levels offer different expected accuracy, those being within 1%, 3%, 6%, and 10% of simulation respectively.

5. Experimental Results

Table 2 shows the timing analysis results for the ISCAS-85 benchmarks and three industrial circuits. The gate-level ISCAS-85 benchmarks were mapped to transistor level using a sample library. The remaining circuits are transistor-level custom blocks: a portion of a data-path block (ckt1), an ALU (ckt2), and a large multiplier (ckt3). Transistor count for each circuit is given in the table. A full timing analysis was performed for each circuit. Included in the table are the run times in seconds (RunT) and the longest path delays in nanoseconds (Delay) obtained with caching levels 0 (no caching), 2 and 4. Notice that the run time goes down on average by 40% for caching level 2, with the maximum reduction being 96% for c6288, which has a very regular structure consisting of a 2-D array of full adders. The average run time reduction is 47% for caching level 4, with the maximum reduction being, again, 96% for c6288. The run time reduction is generally higher for larger circuits, indicating the effectiveness of the cache. As for the path delays, the level 2 results are on average within 0.19% of those of level 0, with the maximum difference being 4%. The level 4 results are on average within 0.25% of those of level 0, with the maximum difference being 6%. These results illustrate that the accuracy loss due to caching is minimal.

TABLE 2

| Circuit | Trans. count | Cache level 0 | | Cache level 2 | | Cache level 4 | |
|---|---|---|---|---|---|---|---|
| | | RunT | Delay | RunT | Delay | RunT | Delay |
| c432 | 784 | 658 | 6.92 | 441 | 6.91 | 428 | 6.91 |
| c499 | 1364 | 901 | 10.98 | 707 | 10.95 | 674 | 10.96 |
| c880 | 1802 | 415 | 6.33 | 296 | 6.34 | 255 | 6.28 |
| c1355 | 2196 | 511 | 7.24 | 389 | 7.22 | 300 | 7.20 |
| c1908 | 3878 | 863 | 9.13 | 566 | 9.13 | 470 | 9.10 |
| c2670 | 5684 | 1259 | 10.80 | 771 | 10.84 | 598 | 10.86 |
| c3540 | 7822 | 1668 | 12.99 | 1062 | 12.91 | 826 | 12.87 |
| c5315 | 11308 | 2504 | 12.22 | 1595 | 12.20 | 1222 | 12.30 |
| c6288 | 10112 | 2756 | 32.78 | 107 | 32.73 | 97 | 32.73 |
| c7552 | 15512 | 3530 | 7.65 | 2583 | 7.66 | 1973 | 7.64 |
| ckt1 | 7973 | 2750 | 85.74 | 2138 | 89.29 | 2018 | 90.50 |
| ckt2 | 10527 | 4930 | 30.70 | 3471 | 30.57 | 2774 | 30.57 |
| ckt3 | 29556 | 45262 | 9.55 | 9892 | 9.53 | 9454 | 9.52 |
| Avg. diff. from cache level | | — | — | −40% | 0.19% | −47% | 0.25% |

Experiments were also performed to compare the accuracy of EMU2 against a commercial SPICE simulator. For each circuit, the longest path identified with EMU2 was simulated with SPICE using the worst-case conditions as described above. The EMU2 calculated path delays were found to differ from SPICE by less than 1%. Given the speed advantage of EMU2 over SPICE, it is clear that the proposed method results in considerable reduction in computational effort with a minimal loss in accuracy.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

The invention claimed is:

1. A method for transistor-level static timing analysis using embedded simulation, comprising:
    partitioning a circuit into a number of basic sub-circuits;
    identifying parameterizable masters corresponding to said basic sub-circuits;
    pre-loading the masters identified into a simulator comprising a processor;
    pre-loading device models into the simulator;
    simulating by the processor one or more said masters, one master at a time with a set of parameters which represent a basic sub-circuit, wherein the act of simulating one or more said masters comprises deriving interpolated results based at least in part upon a result for a corresponding basic sub-circuit with different parameters from a previous simulation; and
    storing results of the simulation in a cache.

2. The method of claim 1, wherein each of said masters, when simulation is performed, is electrically coupled to an equivalent loading system whose parameters are equivalent to those of actual loading devices of said basic sub-circuits in context.

3. The method of claim 2, wherein said equivalent loading system comprises a plurality of classes of devices, which are electrically coupled to each other.

4. The method of claim 3, wherein said classes of devices comprise any of p-gate and n-gate devices.

5. The method of claim 1, said act of identifying further comprising:
    extracting a new master each time a new class of basic sub-circuit is identified.

6. The method of claim 1, said act of simulating further comprising the steps of:
    setting parameters for a particular sub-circuit along with its input conditions; and
    finding results of a simulation of said sub-circuit.

7. The method of claim 6, said act of finding further comprising:
    querying a cache, which stores results of all previous simulations performed on a variety of masters, and returning results based at least in part upon interpolation of results of all previous simulations performed on a same master to which said sub-circuit belongs;
    wherein if a match is found, said cache returns a stored output waveform in lieu of simulation on said sub-circuit; and
    wherein if no match is found, said simulator performs simulation on said sub-circuit and calculates an output waveform.

8. The method of claim 7, wherein if no match is found, performing the additional act of:
    saving in said cache the result of a simulation performed on said sub-circuit.

9. The method of claim 7, wherein said cache determines whether to return a stored waveform on the basis of a comparison of a calculated value, which represents the closeness between the parameters of a simulated master to which said sub-circuit belongs and the parameters of said sub-circuit.

10. The method of claim 9, further comprising:
    providing a threshold value for said closeness which determines a simulation accuracy when a cached result is used in lieu of simulation.

11. The method of claim 6, wherein said parameters comprise any of device width, device source area, device drain area, device source perimeter, device drain perimeter, wire resistance values, and node wire capacitance values.

12. A method for calculating delays of a circuit, comprising:
    identifying parameterizable masters from said circuit which correspond to basic sub-circuits;
    pre-loading the masters identified into a simulator comprising a processor;
    pre-loading device models into the simulator;
    setting parameters of said masters in said simulator;
    calculating by the processor worst case delays of timing arcs of said masters, wherein the act of calculating comprises deriving interpolated results based at least in part upon a result for a corresponding basic sub-circuit with different parameters from a previous simulation; and
    storing results of the calculation in a cache.

13. The method of claim 12, wherein said master parameters comprise any of device width, device source area, device drain area, device source perimeter, device drain perimeter, wire resistance values, and node wire capacitance values.

14. The method of claim 12, further comprising:
choosing worst case input excitations and internal node initial voltages for each timing arc.

15. The method of claim 14, further comprising:
applying one or more waveforms with a single transition, either rise or fall, to one or more inputs of a sub-circuit.

16. The method of claim 14, further comprising:
deriving, for a primary input, a two-point waveform from an input slew.

17. The method of claim 14, further comprising:
producing, for an intermediate node, an input waveform from an output of a driving gate.

18. The method of claim 14, further comprising:
setting initial voltages for all nodes in a master sub-circuit to an initial state of an arc output;
turning on arc devices on an arc path; and
wherein said arc devices are devices through which said arc output is charged or discharged; and
wherein said arc path is the path from a supply to said arc output through said arc devices.

19. The method of claim 14, further comprising:
overwriting said initial voltages on internal nodes that are connected to supply or ground through permanently turned on devices.

20. The method of claim 14, further comprising:
traversing each device on paths from an arc output node to supply and ground; and
turning on each said device if it does not enable a parallel path to supply or ground.

21. The method of claim 14, further comprising:
if said master sub-circuit has multiple gates connected through a complex pass-gate structure, identifying side paths driving an arc output node, that are enabled by devices triggered by input waveforms;
determining initial voltages and excitation voltages to be used in a circuit simulation for nodes in said side paths by back propagating an output node initial voltage through turned-on pass-gates and driving devices and inverting the voltage polarity through devices triggered by input waveforms.

22. The method of claim 21, wherein said method is applied to any circuit comprised of any combination of static CMOS circuits, pass-gate circuits, latch circuits, and domino circuits.

23. A system for transistor-level timing analysis using embedded simulation, comprising:
a static timing analysis engine;
a processor which is coupled to said static timing analysis engine, said processor processes an input netlist of a circuit and creates an internal representation of said circuit;
an extractor which is coupled to said static timing analysis engine, said extractor identifies and extracts from said circuit all parameterizable masters, which correspond to basic sub-circuits;
a calculator which is coupled to said extractor, said calculator sets parameters for each of said masters and calculates gate delays;
a cache which is coupled to said calculator, said cache stores results of all previous simulations performed on a variety of masters and returns a stored waveform if an input parameter of a particular basic sub-circuit extracted from said circuit are within a first value to the parameters of a simulated master to which said basic sub-circuit belongs; and
a simulator which is coupled to said calculator, wherein said simulator performs simulation on said basic sub-circuit by deriving interpolated results based at least in part up on a result for a corresponding basic sub-circuit with different parameters from a previous simulation if its parameters are not within a second value to the parameters of said simulated master.

24. The system of claim 23, wherein each of said masters, when simulation is performed on it, is electrically coupled to an equivalent loading system whose parameters are equivalent to those of actual loading devices of said basic sub-circuits in context.

25. The system of claim 24, wherein said equivalent loading system comprises a plurality of classes of devices, which are electrically coupled to each other.

26. The system of claim 25, wherein said classes of devices comprise any of p-gate and n-gate devices.

27. The system of claim 23, wherein said extractor traverses said input netlist and identifies all basic sub-circuits included in said circuit, extracting masters using a pattern recognition algorithm to match same basic sub-circuits.

28. The system of claim 23, wherein said extractor creates a new master each time a new basic sub-circuit is identified.

29. The system of claim 23, wherein said extractor creates a hierarchical transistor-level netlist with the masters instantiated at the top level.

30. The system of claim 29, wherein a netlist is preloaded in said simulator.

31. The system of claim 23, wherein said cache returns a waveform based at least in part upon interpolation of simulation results of said master.

32. The system of claim 23, wherein said cache determines whether to return a stored waveform on the basis of a comparison of a calculated value.

33. The system of claim 32, wherein a threshold value is provided which determines a simulation accuracy when a cached result is used in lieu of simulation.

34. The system of claim 23, further comprising a built-in incremental timing capability which is used to recalculate circuit delays affected by local circuit modification.

35. The system of claim 23, further comprising:
a circuit optimization mechanism.

36. The system of claim 23, further comprising:
a circuit characterization mechanism for forming a comprehensive transistor-level timing solution.

* * * * *

UNITED STATES PATENT AND TRADEMARK OFFICE
CERTIFICATE OF CORRECTION

PATENT NO.      : 7,647,220 B2                                         Page 1 of 1
APPLICATION NO. : 10/042512
DATED           : January 12, 2010
INVENTOR(S)     : Kulshreshtha et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 844 days.

Signed and Sealed this

Sixteenth Day of November, 2010

David J. Kappos
*Director of the United States Patent and Trademark Office*